United States Patent
Hassan et al.

(10) Patent No.: US 12,212,120 B2
(45) Date of Patent: Jan. 28, 2025

(54) TUNABLE VERNIER EFFECT LASER EMISSION DEVICE

(71) Applicants: COMMISSARIAT A L'ENERGIE ATOMIQUE ET AUX ENERGIES ALTERNATIVES, Paris (FR); THALES, Courbevoie (FR)

(72) Inventors: Karim Hassan, Grenoble (FR); Quentin Wilmart, Grenoble (FR)

(73) Assignees: COMMISSARIAT A L'ENERGIE ATOMIQUE ET AUX ENERGIES ALTERNATIVES, Paris (FR); THALES, Courbevoie (FR)

( * ) Notice: Subject to any disclaimer, the term of this patent is extended or adjusted under 35 U.S.C. 154(b) by 834 days.

(21) Appl. No.: 17/166,093

(22) Filed: Feb. 3, 2021

(65) Prior Publication Data

US 2021/0255394 A1 Aug. 19, 2021

(30) Foreign Application Priority Data

Feb. 19, 2020 (FR) ..................................... 20 01659

(51) Int. Cl.
*H01S 5/14* (2006.01)
*H01S 5/06* (2006.01)
*H01S 5/10* (2021.01)

(52) U.S. Cl.
CPC ............ *H01S 5/142* (2013.01); *H01S 5/0612* (2013.01); *H01S 5/1032* (2013.01)

(58) Field of Classification Search
CPC ........ H01S 5/142; H01S 5/0218; H01S 5/021; H01S 5/1032; H01S 3/0637; H01S 5/0607–0614

See application file for complete search history.

(56) References Cited

U.S. PATENT DOCUMENTS

| | | | | | |
|---|---|---|---|---|---|
| 5,838,851 A | * | 11/1998 | Wisseman | ........... | G02B 6/2861 385/32 |
| 5,892,869 A | * | 4/1999 | Wisseman | ........... | G02B 6/2861 385/32 |
| 5,896,476 A | * | 4/1999 | Wisseman | ......... | G02B 6/29334 385/32 |
| 6,289,151 B1 | * | 9/2001 | Kazarinov | ............. | B82Y 20/00 385/32 |

(Continued)

FOREIGN PATENT DOCUMENTS

| WO | WO-2014021781 A1 | * | 2/2014 | ............. H01S 5/142 |
|---|---|---|---|---|
| WO | WO-2020035719 A1 | * | 2/2020 | ......... G02B 6/12007 |

OTHER PUBLICATIONS

French Preliminary Search Report issued Oct. 14, 2020 in French Application 20 01659 filed Feb. 19, 2020 (with English Translation of Categories of Cited Documents), 3 pages.

(Continued)

*Primary Examiner* — Joshua King
(74) *Attorney, Agent, or Firm* — Oblon, McClelland, Maier & Neustadt, L.L.P.

(57) ABSTRACT

A wavelength-tunable laser emission device includes a cavity delimited by a first and a second Sagnac mirror. The cavity has an amplifying medium and a tunable spectral filter using the Vernier effect. The filter includes at least three resonant rings arranged in cascade, each resonant ring integrating a loop mirror with wavelength tunable reflectivity.

8 Claims, 4 Drawing Sheets

(56) References Cited

U.S. PATENT DOCUMENTS

| | | | | |
|---|---|---|---|---|
| 6,580,534 | B2* | 6/2003 | Madsen | G02B 6/1225 385/32 |
| 6,891,865 | B1* | 5/2005 | Ma | H01S 5/141 372/20 |
| 7,773,642 | B2* | 8/2010 | Yamazaki | G02F 1/0147 372/99 |
| 8,064,769 | B2* | 11/2011 | Galli | H04J 14/0206 398/83 |
| 9,748,726 | B1* | 8/2017 | Morton | H01S 3/08013 |
| 9,778,493 | B1* | 10/2017 | Krishnamoorthy | H01S 5/142 |
| 11,402,240 | B2* | 8/2022 | Hassan | G01D 5/35335 |
| 2003/0202555 | A1* | 10/2003 | Liu | H01S 5/10 372/94 |
| 2005/0058396 | A1* | 3/2005 | Tormen | G02F 1/3132 385/27 |
| 2005/0068602 | A1* | 3/2005 | Tormen | G02B 6/12004 359/246 |
| 2009/0154505 | A1* | 6/2009 | Oh | G02B 6/12007 372/20 |
| 2009/0285251 | A1* | 11/2009 | Yamazaki | H01S 5/141 372/29.014 |
| 2015/0139264 | A1* | 5/2015 | Zhang | H01S 5/1032 372/107 |
| 2015/0215043 | A1* | 7/2015 | Debregeas | H01S 5/1032 398/79 |
| 2015/0355482 | A1* | 12/2015 | Akiyama | H01S 3/107 385/2 |
| 2016/0170286 | A1* | 6/2016 | le Liepvre | H01S 5/142 385/2 |
| 2017/0139237 | A1* | 5/2017 | Luo | H01S 5/50 |
| 2018/0248334 | A1* | 8/2018 | Ummy | H01S 3/06787 |
| 2021/0255006 | A1* | 8/2021 | Hassan | H01S 5/10 |

OTHER PUBLICATIONS

Komljenovic, T. et al., "Widely-Tunable Ring-Resonator Semiconductor Lasers," Applied Sciences, vol. 7, No. 7, Jul. 17, 2017, XP055688482, 21 pages.

Komljenovic, T. et al., "Monolithically Integrated High-Q Rings for Narrow Linewidth Widely Tunable Lasers," IEEE Journal of Quantum Electronics, vol. 51, No. 11, Nov. 1, 2015, XP011587838, 10 pages.

Elfaiki, H. et al., "Ultra Wide Hybrid III-V On Silicon Tunable Laser," 2018 European Conference on Optical Communication (ECOC), IEEE, Sep. 23, 2018, XP033447609, 3 pages.

Li, A. et al., "Fundamentally Cancel Backscattering in Silicon Microrings," 2017 Conference on Lasers and Electro-Optics Europe & European Quantum Electronics Conference (CLEO/Europe—EQEC). Jun. 25, 2017, XP033240055, 1 page.

Li, A. et al., "Fundamental suppression of backscattering in silicon microrings," Optic Express, vol. 25, No. 3, Feb. 6, 2017, 8 pages.

Hassan, K. et al., "Robust silicon-on-insulator adiabatic splitter optimized by metamodeling," Applied Optics, vol. 56, No. 8, Mar. 10, 2017, 6 pages.

Li, Y. et al., "Tilted silicon-on-insulator grating coupler with improved fiber coupling efficiency and low back reflection based on a silicon overlay," IEEE Photonics Technology Letters, vol. 25, No. 13, Jul. 2013, 4 pages.

* cited by examiner

TUNABLE VERNIER EFFECT LASER EMISSION DEVICE

TECHNICAL FIELD

The field of invention is that of integrated optics and in particular that of photonics on silicon. Within this scope, the invention is directed to a laser emission device tunable over a wide range of emission wavelengths.

Prior Art

First demonstrations of wavelength-tunable semiconductor lasers date back to the 1980s with Distributed Bragg Reflector (DBR) lasers that use mirrors as an optical feedback structure to form a resonant cavity for an amplifying medium.

Since then, the principle of operation of tunable lasers has remained the same with a Fabry-Pérot cavity optically closed by two mirrors, at least one of which is partially reflective, and a spectral filtering element which in the case of a DBR laser is actually integrated into the mirror function. In order to maximize the power emitted and to ensure a single frequency behaviour of the laser, the wavelength favoured by the filter should be coincident with one of the possible modes of the Fabry-Pérot cavity, adjustable by a phase section, and if possible positioned in a spectral zone where the gain is significant.

In order to increase tunability of semiconductor lasers, which is limited to about 10 nm with a DBR filter, it is possible to modify Bragg gratings by adding slightly different subperiodicities in order to benefit from a Vernier effect according to a method known as SG-DBR ("Sampled-Grating DBR"). This modification allowed a tunability higher than 50 nm to be demonstrated. Nevertheless, SG-DBR mirrors have to be long enough to properly perform their filtering function, which results in a very low efficiency of heating elements used to tune them and thus a significant energy operating cost.

To remedy this, it is possible to replace a DBR with separate filtering and reflecting elements, respectively a ring resonator and a Sagnac mirror which is a loop mirror known to be a good achromatic mirror.

As reported in the publication by Hajar Elfaiki et al. ". Ultra Wide Hybrid III-V on Silicon Tunable Laser", ECOC 2018, it is possible to achieve 90 nm tunability by making use of a multiple ring resonator consisting of two resonant rings placed in series, these two rings having very slightly different perimeters in order to obtain a Vernier effect. Indeed, the difference in perimeter generates a difference in free spectral range (FSR) so that the transmission combs of two rings with slightly different FSRs will only coincide at some transmission peaks. The ring resonator then has a higher total FSR than each ring.

In such a tunable spectral filter using a Vernier effect obtained by means of two rings, the free spectral interval is effectively given by $$FSR_t = \frac{FSR_1 \times FSR_2}{FSR_2 - FSR_1}$$

where FSR1 and FSR2 denote the respective free spectral range of each of the rings. By setting the resonance of one ring and shifting the resonance of the other ring by a multiple of $\Delta FSR = FSR_2 - FSR_1$ (for example using a heater), the overall resonance of the filter can be changed. When switching from one overall resonance to another, the difference in resonance order between both resonator rings is always less than 1.

In order to obtain a Vernier effect with a wide tunability, rings with small perimeters are generally used because their respective free spectral range is high, which allows $FSR_t$ to be maximised. By way of example, a tunability of 100 nm could be obtained with two rings having a diameter P1=67.5 µm and P2≈63.59 µm (that is about 10 µm radius for $n_g$=4.46 at λ=1310 nm), thus giving FSR1≈5.7 nm and FSR2≈6.05 nm, that is FSRt≈98 nm.

However, the increase in tunability beyond 90 nm comes up against several phenomena that prevent a stable selection of the emission frequency, either because of increased losses in some spectral bands or because of parasitic reflections.

A technique to limit parasitic reflections from a resonant ring, reported in the publication by Ang Li and Win Bogaerts, "Fundamental suppression of backscattering in silicon microrings", Opt. Express 25(3) 2017, consists in providing the resonant ring with a loop mirror with wavelength tunable reflectivity by means of a phase control section in the form of a Mach-Zehnder interferometer.

However, this technique has a major problem in order to be used in a tunable laser. Indeed, by adding a phase control section and a Sagnac loop, the optical path is dramatically lengthened (around a factor of 3), which reduces the free spectral range of the ring given by $$FSR = \frac{\lambda^2}{n_g P},$$

where P is the resonator perimeter, $n_g$ the group index and λ the wavelength.

The use of this technique would lead to perimeters more than three times larger, greater than 200 nm. Starting from a 200 nm long ring, its free spectral range would be, for $n_g$=4.46 at λ=1310 nm, about 1.924 nm. A tunability of 100 nm could then be achieved by having a second ring with a free spectral interval of about 1.9615 nm. But with such a small deviation between the respective FSRs of each ring (ΔFSR≈0.03 nm), the transmission of the Vernier system is largely degraded with an SMSR (Side Mode Suppression Ratio) in the order of 12 dB.

It is thus noticed that with ring resonators added with a Sagnac loop, the perimeter is large so the FSR is low (typically <2 nm). ΔFSR can possibly be varied to increase FSRt, but the condition ΔFSR>FWHM (Full Width at Half Maximum) should be met not to degrade the SMSR. Indeed, if resonances are too close to each other, the system may have an overall resonance too little damped and lead to the occurrence of a parasitic laser mode. In conclusion, the technique of limiting parasitic reflections leads to an FSRt of a 2-ring Vernier system which is too weak for a wide tunability.

DISCLOSURE OF THE INVENTION

One purpose of the invention is to extend tunability of a semiconductor laser without degrading SMSR in order to guarantee a single frequency laser emission.

To this end, the invention provides a wavelength-tunable laser emission device comprising a first and a second Sagnac mirror as well as a cavity delimited by the first and second Sagnac mirror. The cavity comprises an amplifying medium and a tunable spectral filter using the Vernier effect. This filter comprises at least three resonant rings arranged in cascade, each resonant ring integrating a loop mirror with wavelength tunable reflectivity.

Some preferred but not limiting aspects of this device are the following:

- each resonant ring of said filter includes a Mach-Zehnder interferometric section;
- each of the first and second Sagnac mirrors is comprised of an adiabatic directional coupler fed back through a waveguide;
- the cavity further comprises a phase shift section;
- one of the first and second Sagnac mirrors is partially reflective;
- it further comprises, outside the cavity on the side of the one of the first and second Sagnac mirrors that is partially reflective, a tilted grating coupler to/from a single mode optical fibre; and
- the amplifying medium comprises a III-V heterostructure.

BRIEF DESCRIPTION OF THE DRAWINGS

Other aspects, purposes, advantages and characteristics of the invention will become clearer upon reading the following detailed description of the preferred embodiments of the invention, given as a non-limitative example, and made with reference to the appended drawings in which.

DETAILED DISCLOSURE OF PARTICULAR EMBODIMENTS

Figure 1:
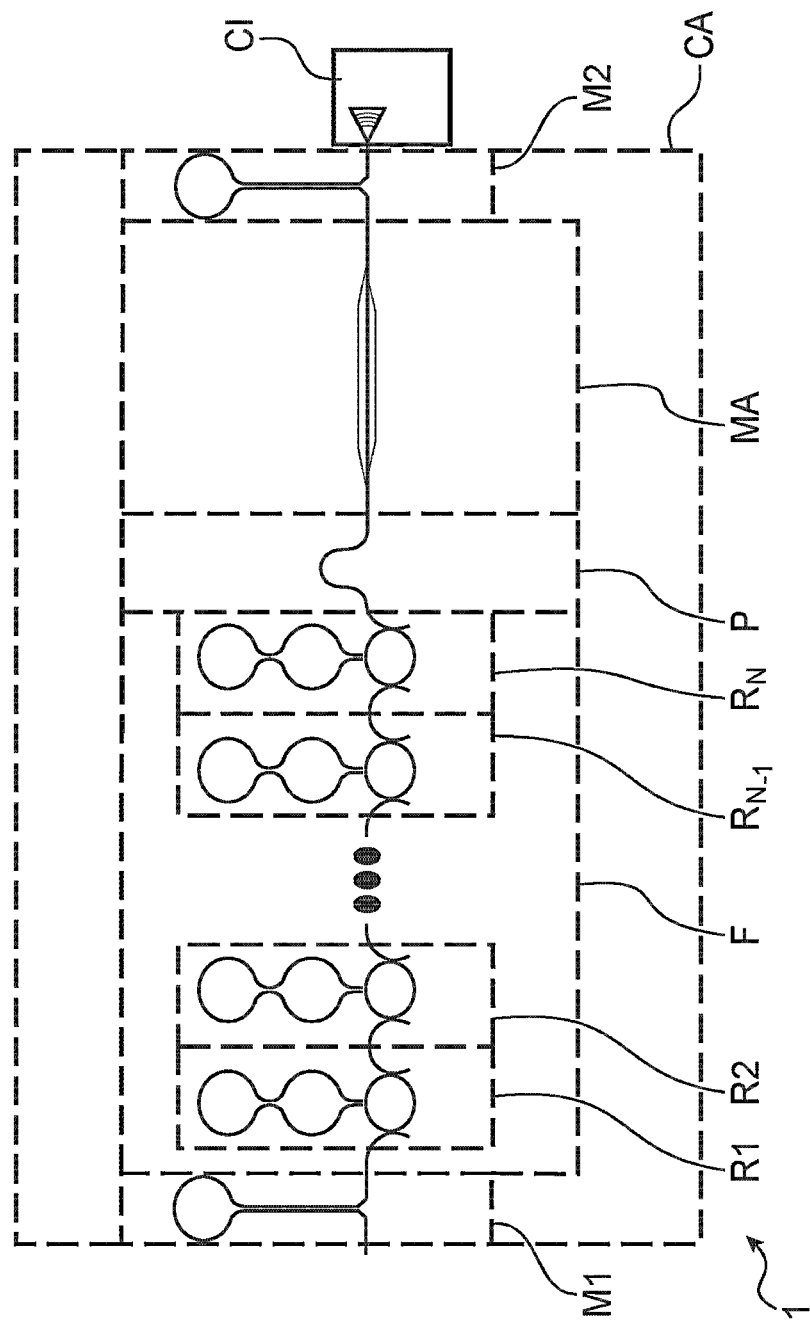
FIG. 1 is a diagram representing a possible architecture of a laser emission device in accordance with the invention.

With reference to FIG. 1, one object of the invention is a wavelength tunable laser emission device 1. This device comprises:

- a first and a second Sagnac mirror M1, M2; and
- a cavity CA delimited by the first and second Sagnac mirrors M1, M2, the cavity comprising an amplifying medium MA and a tunable spectral filter using the Vernier effect F.

In a favoured embodiment of the invention, the amplifying medium comprises a III-V heterostructure. By III-V type heterostructure, it is intended the use of binary, ternary, quaternary materials, which may be chosen from the following non-exhaustive list: InP, GaAs, InGaAlAs, InGaAsP, AlGaAs, InAsP, AlInAs. The heterostructure of such an amplifying medium, also called a gain medium, may include a stack of various layers, such as a stack of layers forming quantum wells sandwiched between a first doped, preferably N-doped, layer, and a second doped, preferably P-doped, layer.

This favoured mode is thus based on the technology of heterogeneous integration of III-V materials with silicon, which enables photonic circuits associating III-V optical sources with silicon-based components to be made. III-V heterogeneous on silicon integration can especially consist in bonding a portion of III-V active material capable of emitting light to a "passive" circuit etched on the surface of a silicon-on-insulator (SOI) substrate. A photonic circuit with an active III-V hybrid on silicon section thus generally comprises:

- an SOI substrate carrying a silicon waveguide,
- a gain structure that includes at least one III-V heterostructure optical amplifying medium, transferred by bonding to the SOI substrate, and
- a thin oxide layer serving as a connecting layer and which separates the gain structure from the silicon waveguide.

The III-V heterostructure is arranged to overlie a section of the silicon waveguide to form a hybrid waveguide section with the same. At this hybrid waveguide section, the vertical proximity of the III-V and silicon guides causes a coupled optical mode to occur, resulting from the hybridization between the fundamental eigenmodes of each of these guides. This coupled mode is transferred from the active III-V/Silicon hybrid active section to passive pure silicon light propagation sections arranged on either side of the hybrid waveguide section. For this purpose, the silicon waveguide is structured to have a modal transition section (taper) between the hybrid active section and the propagation sections.

The propagation sections and hybrid section are delimited by the Sagnac mirrors M1, M2 which thus make up an optical feedback structure capable of forming a resonant cavity CA for the amplifying medium MA. One of the mirrors, here M1, is a high reflectivity mirror which has for example a reflectivity greater than 90%, while the other mirror, here M2, is a low reflectivity mirror (partially reflecting mirror) which has for example a reflectivity less than 50%, typically between 35 and 10%. The low-reflectivity mirror thus forms the optical output of the laser emission device 1. This optical output can be equipped with a grating coupler CI to/from a single-mode optical fibre. This grating coupler is preferably a tilted grating which has the advantage of a reduced reflectivity. The principle of such a tilted grating is for example described in the publication by Yanlu Li et al, "Tilted silicon-on-insulator grating coupler with improved fibre coupling efficiency and low back reflection based on a silicon overlay", IEEE Photonics Technology Letters, vol. 25, no. 13, pp. 1195-1198, July 2013.

In comparison with a diffraction-based DBR mirror, a Sagnac mirror is comprised of a directional coupler fed back through a waveguide and only works by constructive/destructive interference between two guides, which simplifies manufacture thereof since there is no sub-wavelength grating to make. The advantageous Sagnac loop concept has been widely used in the field of optical fibres, a field where silica guides show very low chromatic dispersion, so that Sagnac fibre loops are considered as achromatic. However, this property is no longer valid in integrated optics because when using a directional coupler based on silicon microguides, the coupling rate is wavelength-dependent. Nevertheless, in a favoured embodiment of the invention, each of the first and second Sagnac mirrors M1, M2 uses an adiabatic directional coupler. The adiabatic directional coupler exhibits its near-perfect relative coupling ratios over 100 nm of bandwidth, typically relative coupling ratios between 0.45 and 0.55 over the entire bandwidth, for example over a band between 1260 nm and 1360 nm. An example of the development of such an adiabatic coupler is given, for example, in the publication by Karim Hassan et al, "Robust silicon-on-insulator adiabatic splitter optimized by metamodeling", Applied Optics 56(8) 2017.

In addition to the amplifying medium MA, the cavity CA may include a phase control section P capable of tuning the modes of the Fabry-Pérot cavity CA, by being thermally controlled by means of a heater placed above the section P.

Figure 2:
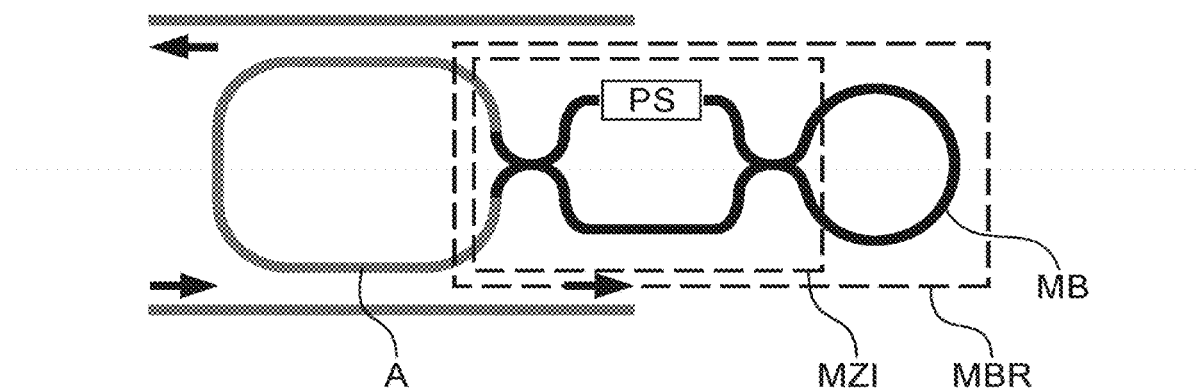
FIG. 2 is a diagram of a resonant ring provided with a loop mirror with wavelength tunable reflectivity.

The cavity CA additionally includes a tunable spectral filter using the Vernier effect F. This filter is a multi-ring resonator comprising several resonant rings arranged in cascade. As represented in FIG. 2, each resonant ring A integrates a loop mirror with wavelength tunable reflectivity MBR. As seen previously, such rings have a low reflectivity due to the addition of the tunable reflectivity loop mirror, which enables back propagation modes generated by light backscattering to be removed. In a favoured embodiment represented in FIG. 2, each resonant ring A integrates a loop mirror MB and an adjustable phase section. The adjustable phase section is typically a Mach-Zehnder interferometric section MZI comprising two arms able to be phase-shifted from each other by means of a thermo-optical phase-shifting element PS acting on one of the arms.

The addition to each resonant ring of the adjustable reflectivity mirror significantly increases the effective length of each resonator. As seen previously, this increase reduces the free spectral range, which is not desirable for high tunability. Anyway, in order to take advantage of this type of low reflectivity resonator while at the same time benefiting from a Vernier effect offering a wide tunability, the filter of the device according to the invention is not provided by two rings as is the case in the state of the art but by a larger number of rings, namely at least three resonant rings R1, R2, $R_{N-1}$, $R_N$ as represented in FIG. 1.

An advantage of such a number of rings is that the overall FSR of the ring systems is no longer restrictive: two resonances can coincide, if the third or fourth resonance does not coincide, there will be no overall resonance of the system. This means that unlike the case with two rings, the difference in order between the resonators can be greater than 1. So there is no need to select the lowest possible ΔFSR since the tunability is no longer limited by $$SR_t = \frac{FSR1 \times FSR2}{FSR_2 - FSR_1}.$$

So both high tunability and good SMSR can be achieved.

An example of dimensioning the at least three rings of the filter is given below, in connection with an exemplary embodiment where the filter consists of five rings.

A reference ring with a free spectral range $FSR_0$ is considered. The other rings of the filter have an FSR expressed as $FSR_i = \alpha_i FSR_0$. The free spectral range of the 2-ring subsystems 0 and i is given by $$FSR_{i-0} = \frac{\alpha_i}{1 - \alpha_i} FSR_0$$

while the tree spectral range of the N-ring system is given by $$\prod \frac{\alpha_i}{1 - \alpha_i} FSR_0.$$

For example, if four rings are considered such that $FSR_1=0.9*FSR_0$, $FSR_2=0.8*FSR_0$ and $FSR_3=0.7*FSR_0$, the overall free spectral range of the system is 0.9*0.8*0.7/(0.1*0.2*0.3)=84*$FSR_0$, that is 126 nm if typical FSR0 of 1.5 nm is assumed. it is thus noticed that the free spectral range of an N-ring system increases with the number of rings, which makes a larger tuning range available.

Let a waveguide with an effective index $n_{eff}$ and a minimum resonant ring perimeter $L_0$. The lowest wavelength to be reached in the system is selected: $\lambda_0=1.26$ μm. The resonance order of the ring 0 is expressed according to $$m_0 = \text{int}\left(\frac{L_0 n_{eff}}{\lambda_0}\right)$$

where the int function is the integer part of the result (i.e. the value rounded down), and its free spectral range is $$FSR_0 = \frac{L_0 n_{eff}}{m_0} - \frac{L_0 n_{eff}}{m_0 - 1}.$$

A tunability range is then selected, for example Δλ=100 nm, and the $\lambda_m=\lambda_0+\Delta\lambda$ is noted. The resonance order shift for ring 0 to reach the maximum wavelength is expressed according to $$N = m_0 - \frac{L_0 n_{eff}}{\lambda_m}$$

and the free spectral range of ring 0 at $\lambda_m$ according to $$FSR_m = \frac{L_0 n_{eff}}{m_0 - N} - \frac{L_0 n_{eff}}{m_0 - N - 1}.$$

The selection of the other rings in terms of free spectral range difference from the reference ring 0 (typically taking ΔFSR>FWHM) is as follows. The ring i should have a free spectral interval $FSR_i$ by imposing its resonance with the condition $\lambda_i=\lambda_0$. Hence $$m_i = 1 + \text{int}\left(\frac{\lambda_0}{FSR_i}\right)$$

and $$L_i = \frac{\lambda_0 m_i}{n_{eff}}.$$

Figure 3:
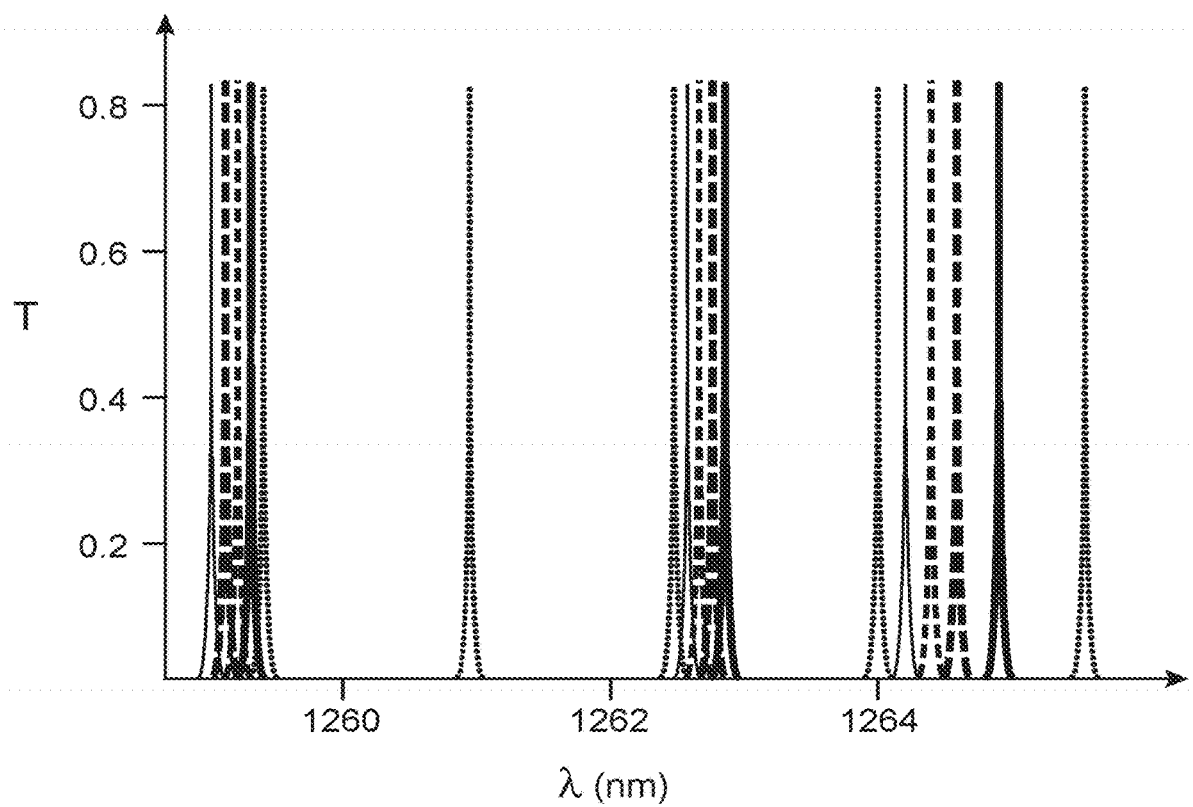
FIG. 3 illustrates coincidence at 1261 nm of the emission peaks of each of five resonant rings of a spectral filter that can be used in the device according to the invention, in the absence of a phase shift applied to the rings.

This selection ensures coincidence at $\lambda_0$ but is not restrictive on the geometry of the other rings. FIG. 3 illustrates the transmission spectrum T as a function of wavelength of a five-ring filter, with respective diameters 350, 368, 388, 411 and 437 μm, for which a resonance coincidence has been imposed at $\lambda_0=1261$ nm.

Since the filter should be tunable in the range $\Delta\lambda$, a resonance of the ring system is sought at $\lambda_s$ such that $\lambda_0 < \lambda_s < \lambda_m$. For this, for each ring $$N_{i,s} = m_i - \mathrm{int}\left(\frac{L_i n_{\mathit{eff}}}{\lambda_s}\right)$$

is determined, that is the resonance order closest to $\lambda_s$ at $$\lambda_{i,s} = \frac{n_{\mathit{eff}} L_i}{m_i - N_{i,s}}.$$

Figure 4:
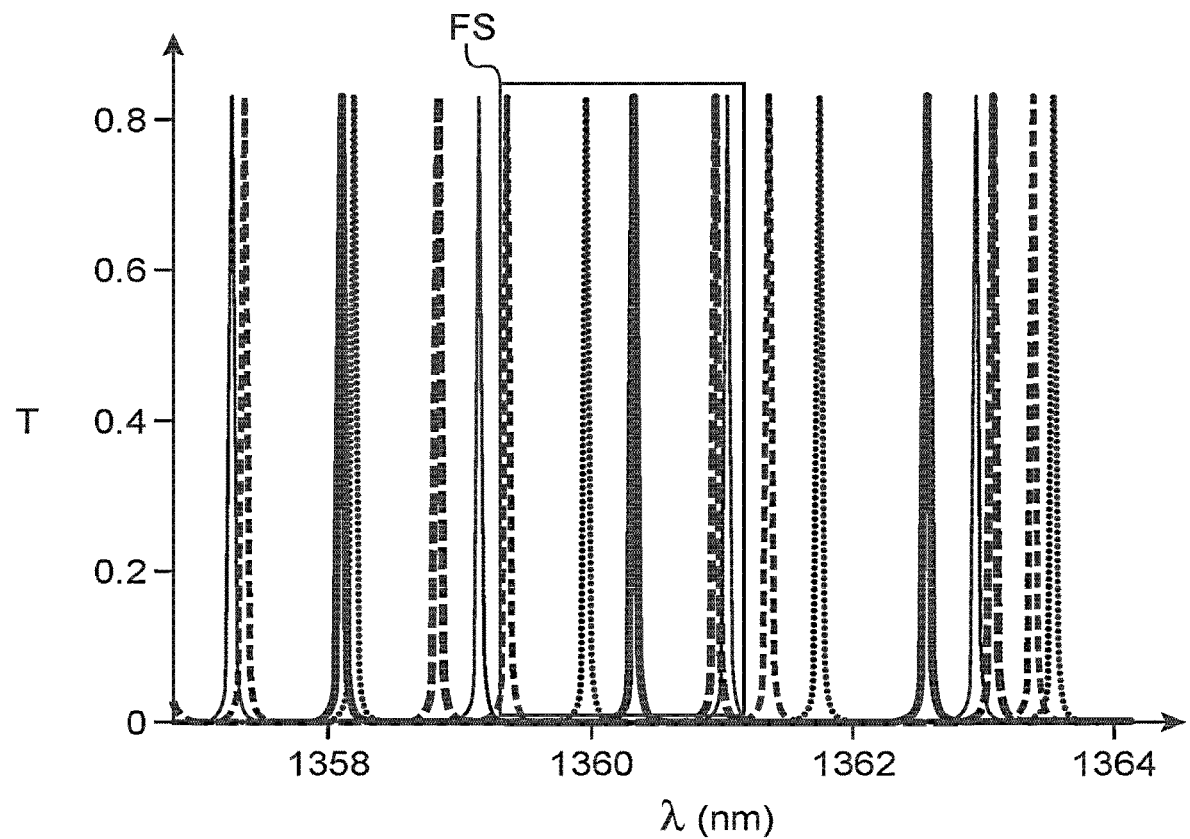
FIG. 4 represents the emission peaks, around 1361 nm, of each of the resonant rings of the five-ring spectral filter, in the absence of a phase shift applied to the rings.

The FSR of each ring is then calculated at $\lambda_s$, $FSR_{i,s}$. For a given $\lambda_s$, and as represented by the window FS in FIG. 4, there is always a resonance of each ring at less than half FSR.

Figure 5:
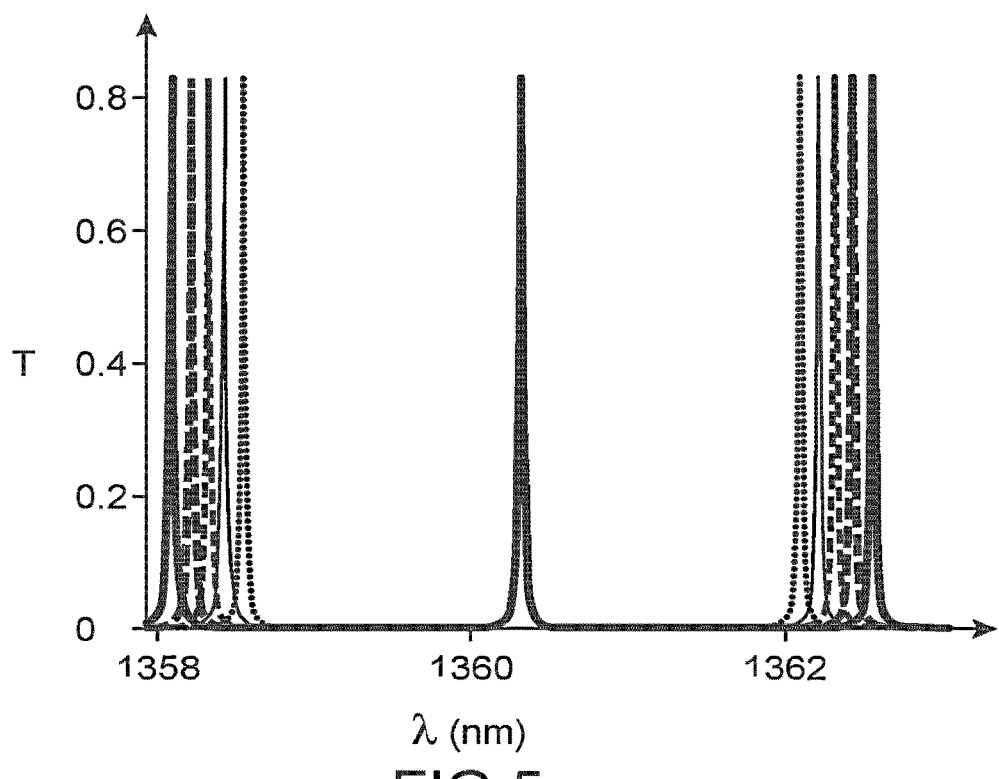
FIG. 5 represents coincidence at 1361 nm of the emission peaks of each of the resonant rings of the five-ring spectral filter, in the presence of a phase shift applied to the rings.

The rings are then attempted to be tuned to be coincident at $\lambda_s$. The phase shift to be applied to each ring is written as $\Delta\phi_i = 2\pi(\lambda_s - \lambda_{i,s})/FSR_{i,s}$. This phase shift can be applied by means of a heater placed above each ring. The individual resonances of the rings at $\lambda_0 + 100$ nm have been represented in FIG. 4, in the absence of a phase shift applied to the rings. A lack of overall resonance of the system is noticed. Additionally, the individual resonances of the rings at $\lambda_0 + 100$ nm have been represented in FIG. 5, with the application of the phase shift $\Delta\phi_i$. A coincidence of the individual resonances and thus an overall resonance of the system are noticed.

Figure 6:
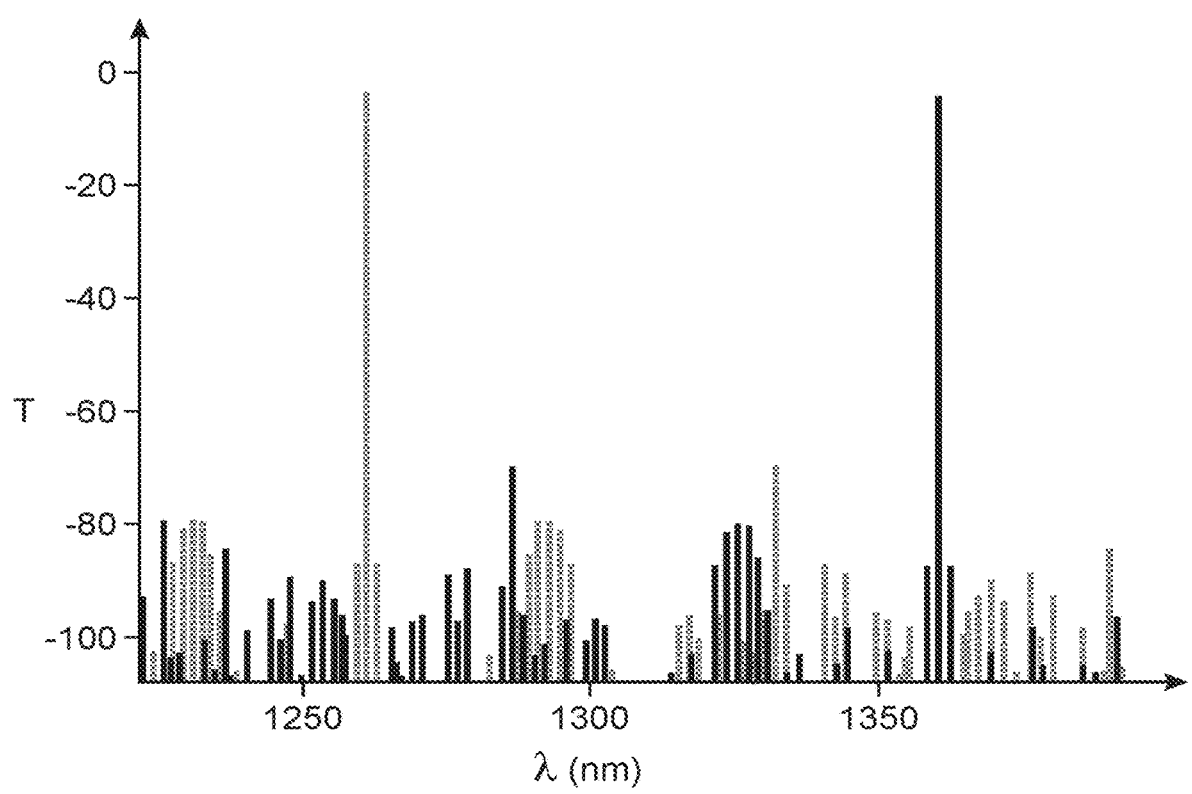
FIG. 6 represents the transmission spectrum of the five-ring filter respectively in the absence of a phase shift applied to the rings (coincidence of the individual resonances at 1231 nm) and in the presence of a phase shift applied to the rings to achieve a coincidence of the individual resonances at 1361 nm.

Additionally, the transmission spectrum T of the 5-ring filter has been represented in FIG. 6 without applying a phase shift (dotted lines; resonance at 1261 nm) and by applying $\Delta\phi_i$ (solid lines; resonance at 1361 nm). The phase shift applied is less than pi, that is the resonance of the rings is shifted by a maximum of half FSR. The filter is thus tunable over 100 nm with an SMSR of more than 60 dB Ultimately, the laser emission device according to the invention can consist of a low-reflection grating coupler, Sagnac loop mirrors with improved bandwidth by using broadband adiabatic directional couplers, and in the core of the tunability mechanism a series of resonant rings with low reflectivity. The use of at least three rings makes them compatible with providing a Vernier effect offering wide tunability.

The invention claimed is:

1. A wavelength tunable laser emission device, comprising:
a first and a second Sagnac mirror; and
a cavity delimited by the first and second Sagnac mirrors, the cavity comprising an amplifying medium and a tunable spectral filter using the Vernier effect,
wherein said tunable spectral filter comprises at least three resonant rings arranged in cascade and wherein each resonant ring of the at least three resonant rings integrates a loop mirror with tunable wavelength reflectivity, wherein a free spectral range $FSR_0$ of a first one of the rings is given as $$FSR_0 = \frac{L_0 n_{\mathit{eff}}}{m_0} - \frac{L_0 n_{\mathit{eff}}}{m_0 - 1}$$

wherein the free spectral range $FSR_i$ of other rings i is given as $$m_i = 1 + \mathrm{int}\left(\frac{\lambda_0}{FSR_i}\right)$$

where:
$m_0$ is a resonance order of the first one of the rings as is given as:

$$m_0 = \mathrm{int}\left(\frac{L_0 n_{\mathit{eff}}}{\lambda_0}\right),$$

$\lambda_0$ is a lowest wavelength to be reached,
$L_0$ is a minimum resonant ring perimeter, and
$n_{\mathit{eff}}$ is an effective index.

2. The device according to claim 1, wherein each resonant ring of the at least three resonant rings comprises a Mach-Zehnder interferometric section.

3. The device according to claim 1, wherein each of the first and second Sagnac mirrors is comprised of an adiabatic directional coupler fed back through a waveguide.

4. The device according to claim 1, wherein the cavity further comprises a phase shift section.

5. The device according to claim 1, wherein one of the first and second Sagnac mirrors is partially reflective.

6. The device according to claim 5, further comprising, outside the cavity on the side of that one of the first and second Sagnac mirrors which is partially reflective, a tilted grating coupler to/from a single-mode optical fibre.

7. The device according to claim 1, wherein the amplifying medium comprises a III-V heterostructure.

8. A wavelength tunable laser emission device, comprising:
a first and a second Sagnac mirror; and
a cavity delimited by the first and second Sagnac mirrors, the cavity comprising an amplifying medium and a tunable spectral filter using the Vernier effect,
wherein said tunable spectral filter comprises at least three resonant rings arranged in cascade and wherein each resonant ring of the at least three resonant rings integrates a loop mirror with tunable wavelength reflectivity, and
wherein each resonant ring of the at least three resonant rings comprises a Mach-Zehnder interferometric section comprising two arms configured to be phase-shifted from each other by a thermo-optical phase-shifting element.

\* \* \* \* \*